US012581781B2

(12) United States Patent (10) Patent No.: US 12,581,781 B2
Yoo et al. (45) Date of Patent: Mar. 17, 2026

(54) LIGHT EMITTING DIODE FOR IMPLEMENTING WHITE LIGHT

(71) Applicant: SEOUL VIOSYS CO., LTD., Gyeonggi-do (KR)

(72) Inventors: Hong Jae Yoo, Gyeonggi-do (KR); Sung Ryong Cho, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 671 days.

(21) Appl. No.: 17/941,058

(22) Filed: Sep. 9, 2022

(65) Prior Publication Data

US 2023/0081464 A1 Mar. 16, 2023

Related U.S. Application Data

(60) Provisional application No. 63/244,873, filed on Sep. 16, 2021, provisional application No. 63/243,915, filed on Sep. 14, 2021.

(51) Int. Cl.
 *H10H 20/851* (2025.01)
 *H10H 20/825* (2025.01)
(52) U.S. Cl.
 CPC ...... *H10H 20/8513* (2025.01); *H10H 20/825* (2025.01)
(58) Field of Classification Search
 None
 See application file for complete search history.

(56) References Cited

U.S. PATENT DOCUMENTS

| | | | | |
|---|---|---|---|---|
| 7,888,670 B2 * | 2/2011 | Han | ..................... | H10H 20/812 257/97 |
| 2006/0049415 A1 | 3/2006 | Liao et al. | | |
| 2015/0083993 A1 | 3/2015 | Nagata et al. | | |
| 2019/0333455 A1 | 10/2019 | El-Ghoroury | | |
| 2019/0348567 A1 | 11/2019 | Na et al. | | |
| 2023/0387351 A1 * | 11/2023 | Takao | ................ | H10H 20/8162 |

FOREIGN PATENT DOCUMENTS

| | | | | | |
|---|---|---|---|---|---|
| CN | 105870286 A | | 8/2016 | | |
| KR | 1020150078089 A | | 7/2015 | | |
| KR | 1020160075162 A | | 6/2016 | | |
| KR | 1020180082887 A | | 7/2018 | | |
| KR | 20190133417 A | * | 12/2019 | ......... | H01L 33/0008 |
| KR | 1020190133417 A | | 12/2019 | | |
| KR | 1020210003893 A | | 1/2021 | | |

OTHER PUBLICATIONS

English translation of International Search Report for International Application No. PCT/KR2022/013612, Dec. 22, 2022, 2 pages.
Extended European Search Report for corresponding European Patent Application No. 22870230.4, Nov. 20, 2025, 7 pages.

* cited by examiner

*Primary Examiner* — Hung K Vu
(74) *Attorney, Agent, or Firm* — LaBatt, LLC

(57) ABSTRACT
A light emitting diode according to an embodiment of the present disclosure includes a first conductivity type semiconductor layer, an active region including a plurality of active layers, a pre-strained layer disposed between the first conductivity type semiconductor layer and the active region, and including a V-pit generation layer (VGL), and a second conductivity type semiconductor layer disposed on the active region, in which the VGL has a thickness within a range of 250 nm to 350 nm.

20 Claims, 11 Drawing Sheets

LIGHT EMITTING DIODE FOR IMPLEMENTING WHITE LIGHT

CROSS-REFERENCE TO RELATED APPLICATIONS AND PRIORITY

This application claims priority to and the benefit of U.S. Provisional Application No. 63/243,915, filed on Sep. 14, 2021 and U.S. Provisional Application No. 63/244,873, filed on Sep. 16, 2021, the disclosures of which are hereby incorporated by reference for all purposes as if fully set forth herein.

TECHNICAL FIELD

The present disclosure relates to a light emitting diode, and more particularly, to a light emitting diode for implementing white light.

BACKGROUND

Nitride semiconductors are used as light sources for displaying apparatuses, traffic lights, lighting, or optical communication devices, and may be mainly used for light emitting diodes or laser diodes that emit blue or green light. In addition, the nitride semiconductors may be used in a heterojunction bipolar transistor (EMT), a high electron mobility transistor (HEMT), and the like.

In general, a light emitting diode using the nitride semiconductor has a heterojunction structure having a quantum well structure between an N contact layer and a P contact layer. The light emitting diode emits light of a specific wavelength depending on a composition of a well layer in the quantum well structure. To increase internal quantum efficiency and reduce losses due to light absorption, the light emitting diode is designed to emit a spectrum of light having a single peak, i.e. monochromatic light.

However, mixed color light emitted from lighting or the like, for example, white light is difficult to implement with a single peak monochromatic light. Accordingly, a technique of implementing white light by using a plurality of light emitting diodes together emitting different monochromatic light from one another or by using a phosphor converting a wavelength of light emitted from the light emitting diode is generally used.

The use of phosphors comes with cost of phosphor or a decrease in efficiency known as a Stoke's shift. In addition, a process of coating phosphor on the light emitting diode and yellowing of a carrier carrying phosphor should also be considered.

Using a mixture of a plurality of light emitting diodes complicates the process, and it is inconvenient to prepare light emitting diodes made of different materials.

When light having a spectrum of multi-bands is implemented using a single-chip light emitting diode, many drawbacks caused by using the plurality of light emitting diodes or using the phosphor can be avoided.

A conventional white light has been implemented through, for example, an LED package that combines a blue LED and a phosphor. However, when a package structure including the LED and the phosphor layer is applied to various applications, there is a space limitation. For design freedom of an LED device, it is necessary to simplify a structure of a light source as much as possible, and it is necessary to prevent reduction of radiation efficiency due to deterioration of the phosphor.

SUMMARY

Embodiments of the present disclosure provide a light emitting diode suitable for implementing mixed color light, for example, white light without using a phosphor.

A light emitting diode according to an embodiment of the present disclosure includes a first conductivity type semiconductor layer; an active region including a plurality of active layers; a pre-strained layer disposed between the first conductivity type semiconductor layer and the active region, and including a V-pit generation layer (VGL); and a second conductivity type semiconductor layer disposed on the active region, in which the VGL has a thickness within a range of 250 nm to 350 nm.

The active region may emit white light having a plurality of peak wavelengths.

The VGL may include a first VGL and a second VGL.

The first VGL may be a single layer, and the second VGL may be a superlattice layer.

The superlattice layer may include an InGaN layer, and a band gap energy of the InGaN layer may be equal to or greater than an energy of light of 405 nm.

The first VGL may be a layer formed using TMGa as a Ga source, and the second VGL may be formed using TEGa as the Ga source.

The pre-strained layer may further include a first intermediate layer and a second intermediate layer, and the first and second intermediate layers may be nitride-based semiconductor layers having a lattice constant smaller than that of the active region.

One of the first and second intermediate layers may be an AlN layer, and the other may be an AlGaN layer.

The first intermediate layer and the second intermediate layer may be disposed between the first VGL and the second VGL.

The first and second VGLs may have a thickness within a range of 1000 Å to 2500 Å, respectively, and the first and second intermediate layers may have a thickness within a range of 10 Å to 150 Å, respectively.

The active region may include at least one active layer emitting blue light, at least one active layer emitting green light, and at least one active layer emitting red light, in which the blue light has a peak wavelength within a range of 410 nm to 495 nm, the green light has a peak wavelength within a range of 520 nm to 605 nm, and the red light has a peak wavelength within a range of 606 nm to 720 nm.

The active layers emitting green light and red light may be disposed between the active layers emitting blue light.

The active region may further include an intermediate barrier layer disposed between the active layers, in which the intermediate barrier layer may have a wider energy band gap than those of barrier layers in the active layers.

The intermediate barrier layer may be formed of a single layer or in multiple layers.

The light emitting diode may further include an electron blocking layer, and the intermediate barrier layer may have a narrower energy band gap than that of the electron blocking layer.

The active region may include at least three active layers, and the intermediate barrier layer may be disposed in at least one of regions between the active layers.

A light emitting diode according to an embodiment of the present disclosure includes a first conductivity type semiconductor layer; an active region including a plurality of active layers; a pre-strained layer disposed between the first conductivity type semiconductor layer and the active region, and including a V-pit generation layer; and a second conductivity type semiconductor layer disposed on the active region, in which the pre-strained layer includes a first VGL, a second VGL, a first intermediate layer, and a second intermediate layer, in which the first intermediate layer and the second intermediate layer have a lattice constant greater than that of the active region.

The active region may emit white light having a plurality of peak wavelengths.

The first VGL may be a GaN layer, and the second VGL may be a GaN/InGaN superlattice layer. One of the first intermediate layer and the second intermediate layer may be an AlN layer, and the other may be an AlGaN layer.

The first intermediate layer and the second intermediate layer may be disposed between the first VGL and the second VGL.

DESCRIPTION OF DRAWINGS

FIG. 4A is a schematic band diagram illustrating a light emitting diode according to an embodiment of the present disclosure.

FIG. 4B is a schematic band diagram illustrating a light emitting diode according to another embodiment of the present disclosure.

DETAILED DESCRIPTION OF EMBODIMENTS

Figure 1:
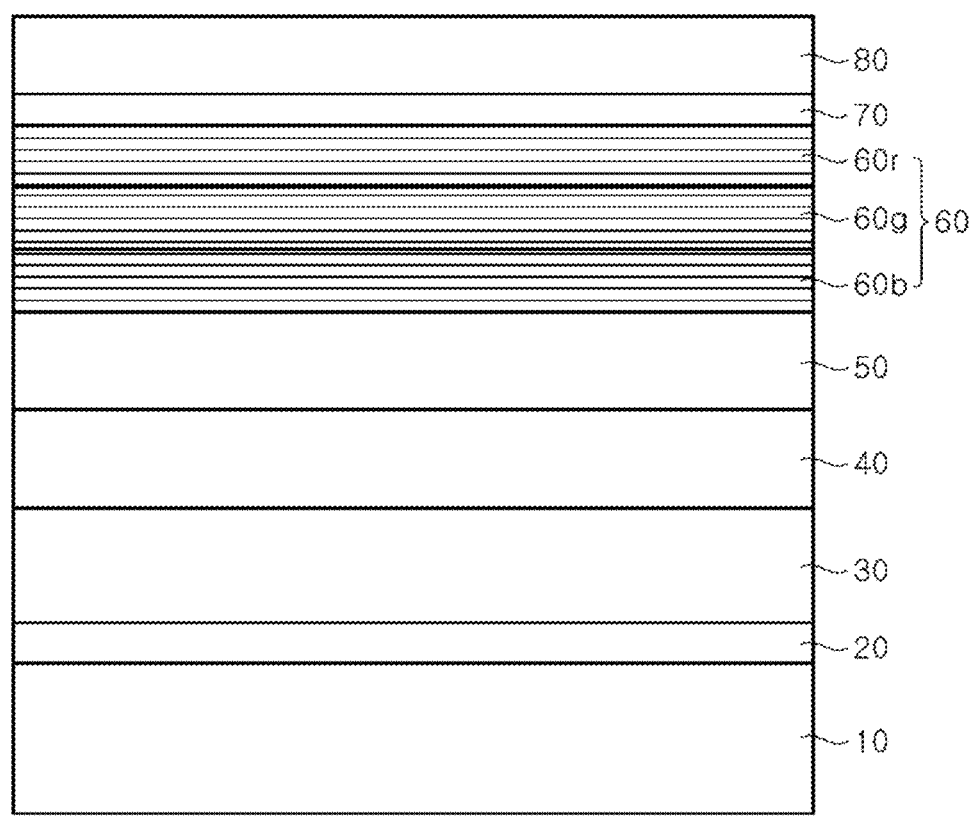
FIG. 1 is a schematic cross-sectional view illustrating a light emitting diode according to an embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the exemplary embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

Figure 2:
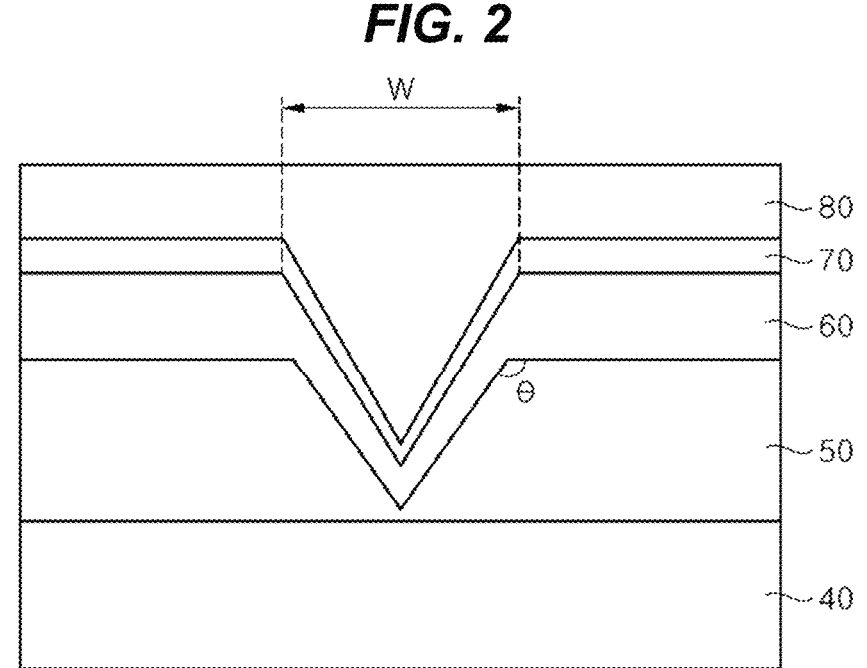
FIG. 2 is an enlarged schematic cross-sectional view of a portion of FIG. 1 to describe the light emitting diode according to an embodiment of the present disclosure.

FIG. 1 is a schematic cross-sectional view illustrating a light emitting diode 100 according to an embodiment of the present disclosure, and FIG. 2 an enlarged schematic cross-sectional view of a portion of FIG. 1 to describe the light emitting diode according to an embodiment of the present disclosure.

Referring to FIG. 1, the light emitting diode 100 may include a substrate 10, a buffer layer 20, an undoped layer 30, a first conductivity type semiconductor layer 40, and a pre-strained layer 50, an active region 60, an electron blocking layer 70, and a second conductivity type semiconductor layer 80.

The substrate 10 may be a growth substrate for growing a gallium nitride-based semiconductor layer, for example, a sapphire substrate, a silicon substrate, a SiC substrate, a spinel substrate, or the like. In an embodiment, the substrate 10 may be a patterned sapphire substrate.

The buffer layer 20 may be formed of a low-temperature buffer layer, for example, a nucleation layer such as an AlGaN layer, for growing a gallium nitride-based semiconductor layer on a heterogeneous substrate. The undoped layer 30 may be, for example, a high-temperature buffer layer, and include a gallium nitride-based semiconductor layer such as a GaN layer.

The first conductivity type semiconductor layer 40 may be a semiconductor layer containing an n-type impurity, for example, Si. The first conductivity type semiconductor layer 40 may be a contact layer on which an ohmic electrode is formed.

The pre-strained layer 50 is disposed between the first conductivity type semiconductor layer 40 and the active region 60. The active region 60 includes a high content of In so as to generate light by recombination of electrons and holes. Accordingly, a lattice constant of the active region 60 is greater than that of the first conductivity type semiconductor layer 40, and accordingly, a strain is generated in the active region 60. The pre-strained layer 50 refers to a layer formed before the active region 60 in which strain is generated.

The pre-strained layer 50 may be formed of a single layer or multiple layers. The pre-strained layer 50 may include a V-pit generation layer (VGL) for generating V-pits. The VGL may be formed of a single layer of a GaN layer or an InGaN layer or multiple layers including a GaN layer and an InGaN layer, and may be formed at a temperature lower than a growth temperature of the first conductivity type semiconductor layer 40, for example, at a temperature equal to or lower than about 900° C. By being grown at a relatively low temperature, the VGL may lower densities of threading dislocations and generate V-pits. The pre-strained layer 50 may also include an intermediate layer so as to compensate for the strain caused by the active region 60. The intermediate layer may be formed of a nitride-based semiconductor layer having a lattice constant smaller than that of the active region 60, and further, may be formed of a nitride-based semiconductor layer having a lattice constant smaller than that of the first conductivity type semiconductor layer 40. The intermediate layer may include, for example, an AlN layer and/or an AlGaN layer.

Figure 3A:
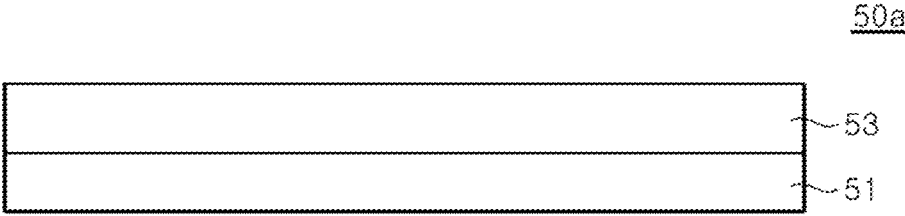
FIG. 3A is a schematic partial cross-sectional view illustrating a light emitting diode according to an embodiment of the present disclosure.
Figure 3B:
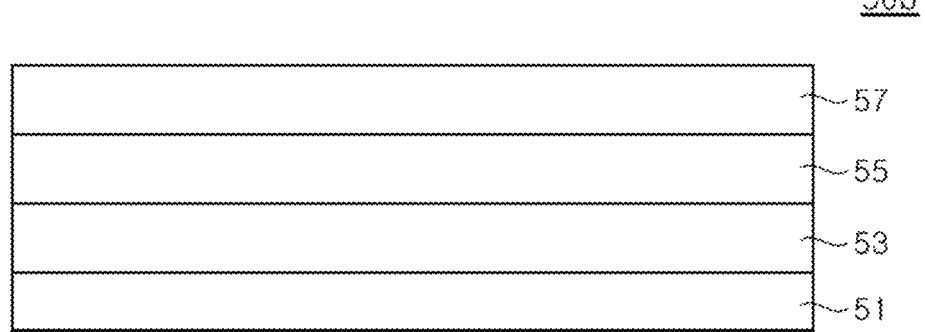
FIG. 3B is a schematic partial cross-sectional view illustrating a light emitting diode according to another embodiment of the present disclosure.
Figure 3C:
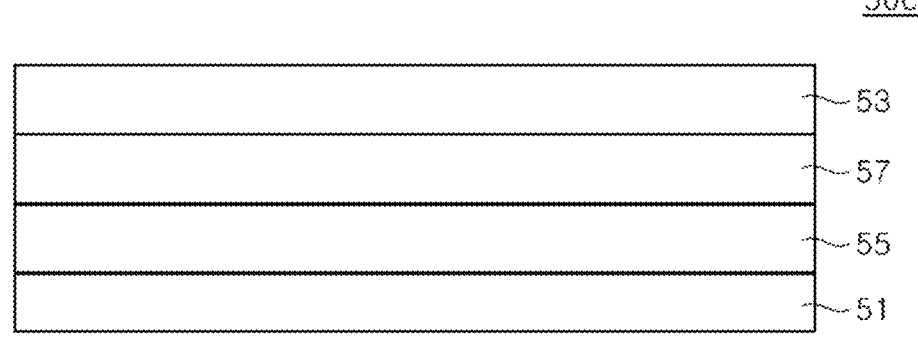
FIG. 3C is a schematic partial cross-sectional view illustrating a light emitting diode according to another embodiment of the present disclosure.

FIGS. 3A through 3C show various examples 50a, 50b, and 50c of the pre-strained layer 50.

Referring to FIG. 3A, a pre-strained layer 50a may include a first VGL 51 and a second VGL 53. For example, both the first VGL 51 and the second VGL 53 may include a GaN layer and/or an InGaN layer. The first VGL 51 may be grown at a relatively rapid rate using trimethylgallium (TMGa) as a Ga source, and the second VGL 53 may be grown at a relatively slow rate using triethylgallium (TEGa) as the Ga source. V-pits are generated by the first VGL 51 grown relatively fast at a low temperature, and subsequently, sizes of the V-pits are increased by the second VGL 53. By growing the second VGL 53 using the TEGa source on the first VGL 51, V-pits of relatively uniform densities and sizes may be formed over an entire wafer area.

For example, the first VGL 51 may be formed of a GaN layer, and the second VGL 53 may be formed of a superlattice layer in which, for example, GaN/InGaN layers are repeatedly stacked. An In content of InGaN may be set such that a band gap energy of InGaN is equal to or greater than an energy of light having a wavelength of 405 nm. That is, at least one layer of the first VGL 51 and the second VGL 53 may be formed to have a same composition of a material. Accordingly, since a lattice change is minimized, it may contribute to generating a white light source with reduced defects.

A same material used for the first VGL 51 and the second VGL 53 may be a material having an energy band gap larger than that of light generated in the active layer, and may be a material having a lower light absorptivity than that of a well layer of the active layer with respect to light generated in the active layer. Accordingly, light emission efficiency may be increased by preventing absorption of light in an emission path.

A thickness of the first VGL 51 may be within a range of about 1000 Å to 2500 Å, and a thickness of the second VGL 53 may be within a range of about 1000 Å to 2500 Å. In an embodiment, the thickness of the first VGL 51 may be equal to or greater than that of the second VGL 53. The thickness of the first VGL 51 may be equal to or greater than that of the second VGL 53, and may be less than or equal to three times of the thickness of the second VGL 53. In a particular embodiment, a sum of the thicknesses of the first VGL 51 and the second VGL 53 may be within a range of 250 nm to 350 nm range. By adjusting the sum of the thicknesses of the first VGL 51 and the second VGL 53 in the range of 250 nm to 350 nm, white light of high luminous intensity may be implemented by a combination of light emitted from the active region 60.

Meanwhile, the first VGL 51 and the second VGL 53 may be doped with an impurity, for example, Si. A Si doping concentration doped in the first VGL 51 may be higher than a Si doping concentration doped in the second VGL 51. For example, the Si doping concentration doped in the first VGL 51 may be within a range of about $8 \times 10^{17} \sim 8 \times 10^{18}/cm^3$, and the Si doping concentration doped in the second VGL 53 may be within a range of about $5 \times 10^{17} \sim 5 \times 10^{18}/cm^3$.

Referring to FIG. 3B, a pre-strained layer 50b may further include a first intermediate layer 55 and a second intermediate layer 57 in addition to the first and second VGLs 51 and 53 described with reference to FIG. 3A. The first intermediate layer 55 and the second intermediate layer 57 may be formed of a nitride-based semiconductor layer having a smaller lattice constant than that of the active region 60, and further, may be formed of a nitride-based semiconductor layer having a smaller lattice constant than that of the first conductivity type semiconductor layer 40. The first intermediate layer 55 and the second intermediate layer 57 may have a smaller lattice constant and a wider band gap than those of the first VGL 51 and the second VGL 53. One of the first intermediate layer 55 and the second intermediate layer 57 may be an AlN layer, and the other may be an AlGaN layer. Average band gap energies of the first intermediate layer 55 and the second intermediate layer 57 disposed over the first VGL 51 and the second VGL 53 may be 0.05 eV or more greater than those of the corresponding first VGL 51 and the second VGL 53, respectively. Maximum band gap energies in the first intermediate layer 55 and the second intermediate layer 57 may be 0.12 eV or more greater than those of the corresponding first VGL 51 or the second VGL 53, respectively. By disposing the first intermediate layer 55 and the second intermediate layer 57 having relatively large band gap energies, it is possible to reduce light absorption in the pre-strained layer 50, and accordingly, light extraction efficiency of the light emitting diode may be improved. In addition, an energy barrier is formed on an interface between the first and second VGLs 51 and 53 and the first and second intermediate layers 55 and 57 due to a difference in band gap, so that a current distribution becomes uniform in the V-pit, and thus, a radiation efficiency of white light is increased.

In addition, the first intermediate layer 55 and the second intermediate layer 57 having a small refractive index are disposed between the active region 60 and the first and second VGLs 51 and 53, so that light may be refracted in a lateral direction, and thus, white light may be effectively emitted in a wide viewing angle range.

By disposing the first intermediate layer 55 and the second intermediate layer 57 under the active region 60, a strain caused by the active region 60 may be relieved. The first intermediate layer 55 and the second intermediate layer 57 are for relieving the strain generated by the active region 60, and thicknesses thereof may be significantly smaller than those of the first and second VGLs 51 and 53. For example, the first intermediate layer 55 and the second intermediate layer 57 may have a thickness within a range of about 10 Å to 150 Å, respectively.

Referring to FIG. 3C, a pre-strained layer 50c is similar to the pre-strained layer 50b described with reference to FIG. 3B, except that the first intermediate layer 55 and the second intermediate layer 57 are disposed between the first VGL 51 and the second VGL 53.

Since the first intermediate layer 55 and the second intermediate layer 57 have relatively small thicknesses compared to those of the first and second VGLs 51 and 53, their locations under the active region 60 may be freely changed. At least one of the first and second VGLs 51 and 53 may have a thickness that is 8 times greater than that of at least one of the first intermediate layer 55 and the second intermediate layer 57. Although the first and second intermediate layers 55 and 57 have relatively small lattice constants, a balance of lattice constants on an interface thereof is effectively matched because the first and second VGLs 51 and 53 are relatively thicker.

A size of the V-pit may be adjusted by the first and second VGLs 51 and 53. When the thicknesses of the first and second VGLs 51 and 53 are increased, the size of the V-fit may be increased. As shown in FIG. 2, the size of the V-pit may be defined as a size of a width W of an inlet of the V-pit. The V-pit may be completely filled by the second conductivity type semiconductor layer 80, and thus, the width W of the inlet of the V-pit may be defined as a width of an inlet on a surface of the electron blocking layer 70. In a case of the absence of the electron blocking layer 70, the width W may be defined as a width of an inlet on a surface of the active region 60.

The width of the inlet of the V-pit may be increased in proportion to the thickness of the VGL, for example, the thicknesses of the first and second VGLs 51 and 53. Since the thicknesses of the first and second intermediate layers 55 and 57 are relatively very small, it can be seen that the width of the inlet of the V-pit is increased in proportion to a thickness of the pre-strained layer 50. For example, more than 80% of the V-pits in a 100um×100um region may have a width W within a range of ±10% of the thicknesses of the VGLs 51 and 53 or the thickness of the pre-strained layer 50. In addition, an angle ⊖ between an inclined surface of the V-pit and a flatness of the pre-strained layer 50 may be within a range of 120° to 150°. As it will be described later, the light emitting diode 100 may have a high luminous intensity within a specific V-pit size range, and when the V-pit size is smaller than the above range, it is difficult to implement white light, and also when the size thereof is larger than the above range, the luminous intensity is excessively low, thereby making it difficult to use it as a light source.

Meanwhile, as the size of the V-pit is increased, a density of the V-pit may be decreased. That is, by adjusting the thicknesses of the VGLs 51 and 53, the density of the V-pit is adjusted. Furthermore, the V-pits formed by the pre-strained layer 50 facilitate to relieve a strain and allow more Indium to be introduced into the active region formed thereon. Accordingly, it is possible to include a multi-quantum well structure containing more Indium in the active region 60 of the light emitting diode 100, and thus, long-wavelength visible light such as red light may be easily implemented, a luminous efficiency of such long-wavelength light may be improved, and furthermore, white light emitting diodes of various colors may be easily manufactured.

Referring back to FIG. 1, the active region 60 may include a plurality of active layers 60b, 60r, and 60g, and white light may be implemented by mixing lights emitted from these active layers 60b, 60g, and 60r. The active layer 60b may have, for example, a multi-quantum well structure emitting blue light within a range of 410 nm to 495 nm, the active layer 60g may have a multi-quantum well structure emitting green light or yellow light within a range of 520 nm to 605 nm, and the active layer 60r may have a multi-quantum well structure emitting red light within a range of 606 nm to 720 nm. The active layers 60b, 60g, and 60r may be formed using a gallium nitride-based semiconductor layer, and may emit light of a desired color according to an In content in the well layer.

Although the active region 60 is illustrated and described as including the active layers 60b, 60g, and 60r, the inventive concepts are not limited thereto. The active region 60 may implement white light by active layers emitting light of two types of colors. For example, white light may be implemented by the active layer 60b emitting blue light and the active layer 60g emitting yellow light, or the active layer 60b emitting blue light and the active layer 60r emitting red light. Table 1 shows two types of monochromatic complementary wavelengths ($\lambda 1$, $\lambda 2$) for implementing white light of 6500K and power ratios required for these wavelengths.

TABLE 1

| Complementary Color | | Luminous Intensity Ratio |
|---|---|---|
| $\lambda 1$(nm) | $\lambda 2$(nm) | P($\lambda 2$)/P($\lambda 1$) |
| 380~400 | 540~570 | 0.000642~0.0785 |
| 400~420 | 540~570 | 0.0785~0.89 |
| 420~430 | 540~570 | 0.89~1.42 |
| 430~450 | 540~570 | 1.42~1.79 |
| 450~470 | 540~570 | 1.79~1.09 |
| 470~480 | 570~600 | 1.09~0.81 |
| 480~490 | 600~630 | 0.81~0.668 |

As shown in FIG. 2, the active region 60 is formed along the V-pit, and thus, the V-pit may become larger by the active region 60.

The electron blocking layer 70 is disposed on the active region 60. The electron blocking layer 70 is formed along the surface of the active region 60. As shown in FIG. 2, the electron blocking layer 70 may be formed along the V-pit formed in the active region 60.

The second conductivity type semiconductor layer 80 may be disposed on the electron blocking layer 70. The second conductivity type semiconductor layer 80 may fill the V-pit as shown in FIG. 2, but the inventive concepts are not limited thereto. For example, the second conductivity type semiconductor layer 80 may be formed along the V-pit, and thus, grooves corresponding to the V-pit may remain on a surface of the second conductivity type semiconductor layer 80.

The second conductivity type semiconductor layer 80 may be a nitride-based semiconductor layer doped with a p-type impurity, for example, Mg. The second conductivity type semiconductor layer 80 may include, for example, a GaN layer. The second conductivity type semiconductor layer 80 may be a contact layer on which an ohmic electrode is formed.

According to the illustrated embodiment, by using the active region 60 having the plurality of active layers 60b, 60g, and 60r, a white light emitting diode having, for example, desired color coordinate values (x=0.205~0.495, y=0.19~0.45) on a color coordinate (CIE) may be implemented without using a phosphor. Furthermore, by employing the light emitting diode 100 according to the illustrated embodiment, high-efficiency white light may be implemented at a given input current density value by adjusting the size of the V-pit without using the phosphor.

Moreover, since light of a desired color is emitted using the active layers 60b, 60g, and 60r, an intensity of light of a specific color may be easily adjusted. For example, to make a radiation intensity of blue light higher than that of green light, active layers emitting blue light may be disposed more than active layers emitting green light. This will be described again later.

Figures 4A, 4B:
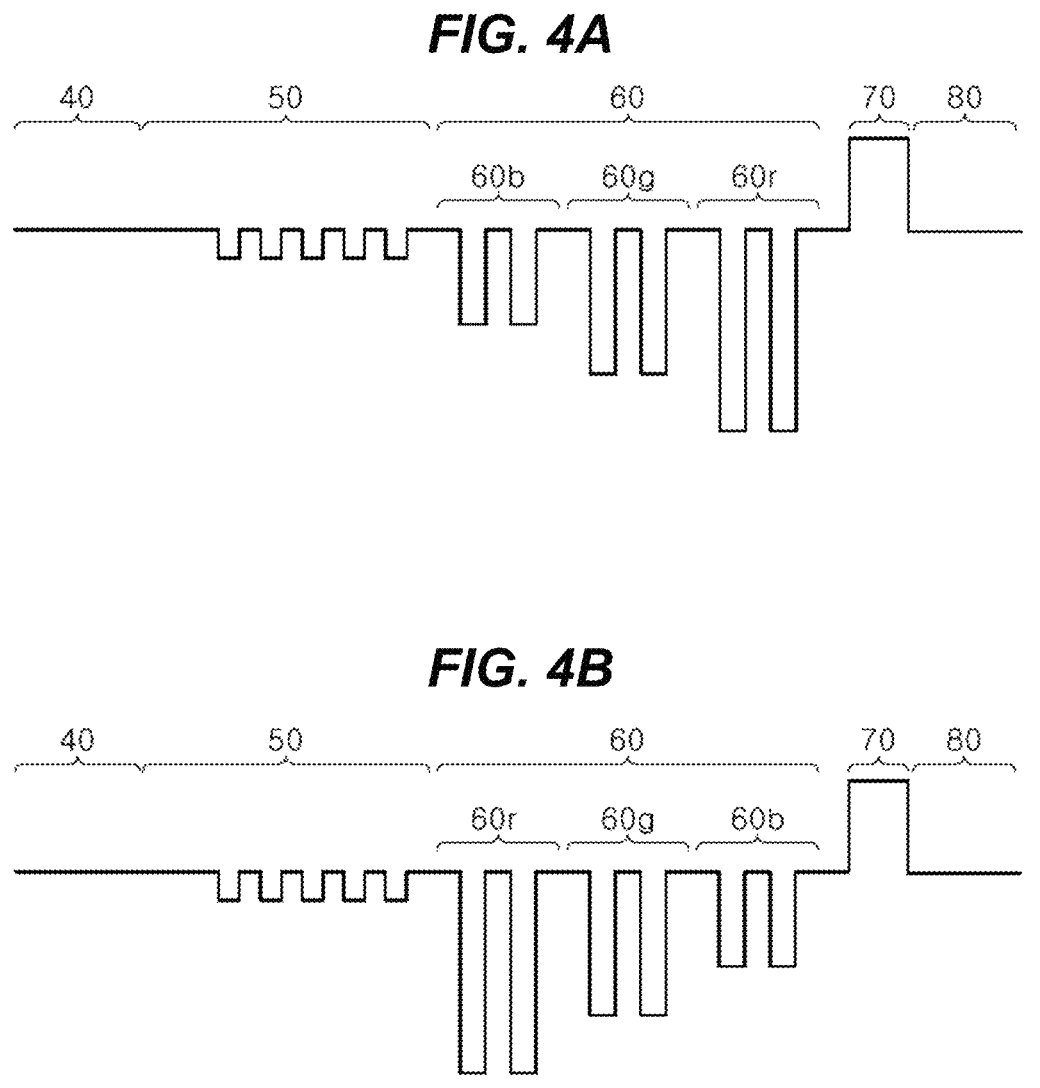

FIG. 4A is a schematic band diagram illustrating a light emitting diode according to an embodiment of the present disclosure. Here, only conduction bands are shown, and valence bands are omitted. In addition, a conduction band of a pre-strained layer 50 is shown based on the pre-strained layer 50a of FIG. 3A. The first intermediate layer 55 and the second intermediate layer 57 of FIG. 3B and FIG. 3C are not shown separately because their thicknesses are very small. Conduction bands of the first intermediate layer 55 and the second intermediate layer 57 may be positioned higher than those of first and second VGLs 51 and 53. Meanwhile, although each of active layers 60b, 60g, and 60r is illustrated as having two well layers for convenience, the inventive concepts are not limited thereto, and may have three or more well layers.

Referring to FIG. 4A, as described with reference to FIG. 3A, the pre-strained layer 50 may include a first VGL 51 having a same conduction band as that of a first conductivity type semiconductor layer 40 and a second VGL 53 having a superlattice structure. The second VGL 53 may have, for example, a GaN/InGaN superlattice structure. The pre-strained layer 50 is disposed between the first conductivity type semiconductor layer 40 and an active region 60.

Meanwhile, the active region 60 includes a plurality of active layers 60b, 60g, and 60r, and these active layers 60b, 60g, and 60r may be disposed such that band gap energies decrease as a distance from the first conductivity type semiconductor layer 40 increases. Since blue light emitted from the active layer 60b has a higher energy than the band gap energies of the active layers 60g and 60r, the light emitting diode according to the illustrated embodiment may be manufactured in a structure in which light generated in the active region 60 is emitted through the first conductivity type semiconductor layer 40.

FIG. 4B is a schematic band diagram illustrating a light emitting diode according to another embodiment of the present disclosure. The light emitting diode according to this embodiment is similar to the light emitting diode described with reference to FIG. 4A, but has a difference in that the active layers 60r, 60g, and 60b are arranged such that the farther the active layers 60r, 60g, and 60b are apart from the first conductivity type semiconductor layer 40, the wider the band gap energies of the active layers 60r, 60g, and 60b are.

According to this embodiment, since blue light emitted from the active layer 60b has a higher energy than band gap energies of the active layers 60g and 60r, the light emitting diode according to this embodiment may be manufactured in a structure in which light generated in an active region 60 is emitted through a second conductivity type semiconductor layer 80.

Figure 5:
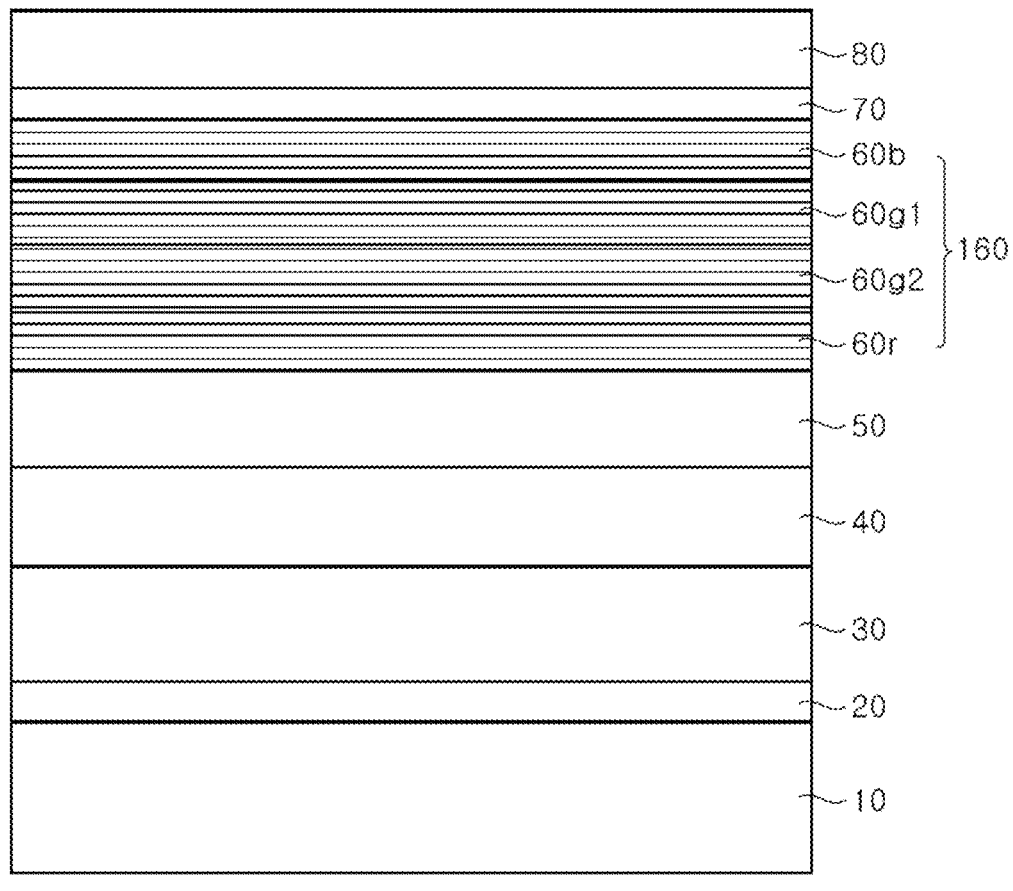
FIG. 5 is a schematic cross-sectional view illustrating a light emitting diode according to another embodiment of the present disclosure.

FIG. 5 is a schematic cross-sectional view illustrating a light emitting diode 200 according to another embodiment of the present disclosure.

Referring to FIG. 5, the light emitting diode 200 according to this embodiment is substantially similar to the light emitting diode described with reference to FIG. 1, except that an active region 160 includes active layers 60g1 and 60g2 emitting a plurality of green lights, and locations of active layer 60r emitting red light and active layer 60b emitting blue light are reversed.

In this embodiment, the active layer 60b emitting blue light having a relatively shorter wavelength is disposed closer to a first conductivity type semiconductor layer 40 than the active layer 60r emitting red light having a relatively longer wavelength. Light emitted from the active region 160 may be emitted to the outside through the first conductivity type semiconductor layer 40.

As previously described with reference to FIG. 4A and FIG. 4B, the locations of the active layer 60b emitting blue light and the active layer 60g emitting red light may be reversed depending on a direction in which light is emitted. For example, to emit light to the outside through a second conductivity type semiconductor layer 80, the active layer 60b emitting blue light may be disposed closer to the second conductivity type semiconductor layer 80 than the active layer 60r emitting red light.

Meanwhile, in this embodiment, since the light emitting diode 200 includes the active layers 60g1 and 60g2 emitting the plurality of green light, a radiation intensity of green light may be increased. Since green light has better luminous efficacy than blue light or red light, visibility of light emitted from the light emitting diode 200 may be improved.

For example, the active layer 60b may emit light within a wavelength range of 410 nm to 495 nm, the active layer 60g1 may emit light within a wavelength range of 520 nm to 555 nm, the active layer 60g2 may emit light within a wavelength range of 560 nm to 605 nm, and the active layer 60r may emit light within a wavelength range of 606 nm to 720 nm.

Figure 6:
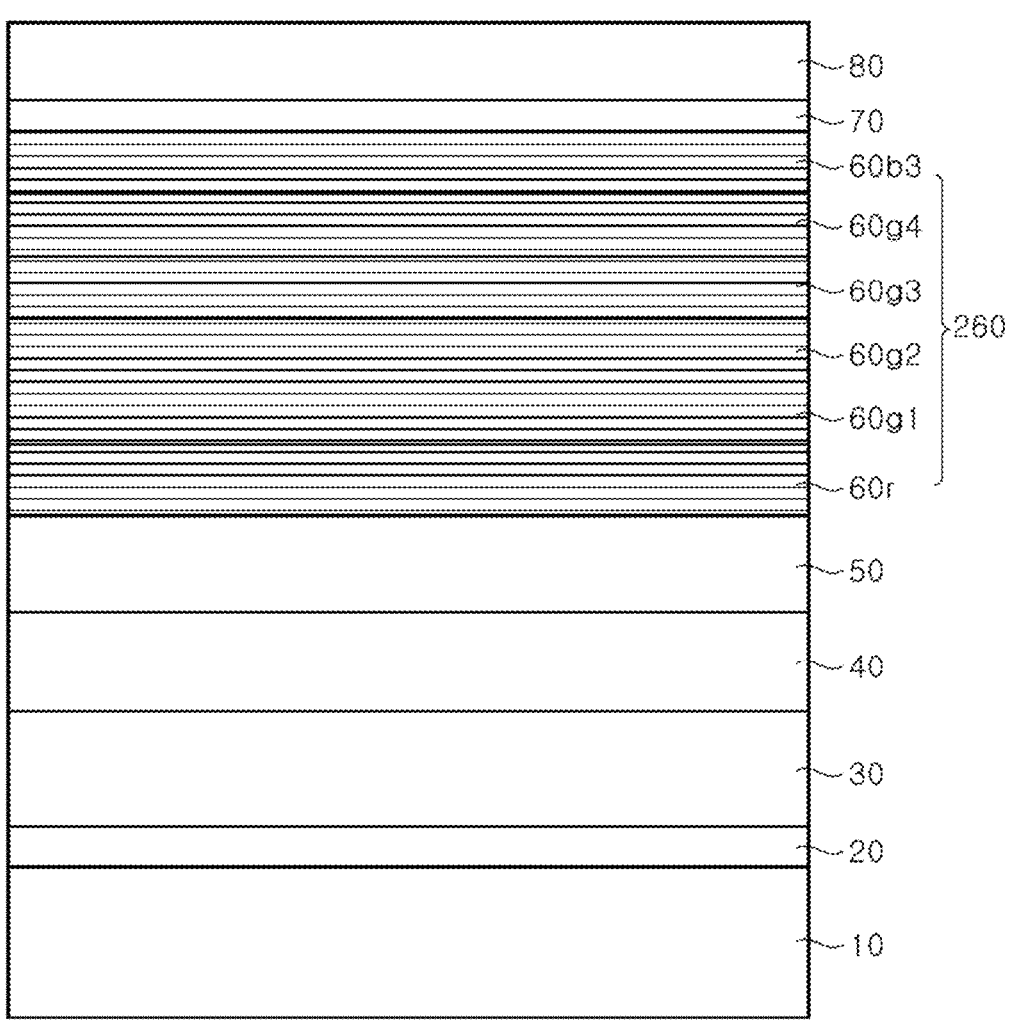
FIG. 6 is a schematic cross-sectional view illustrating a light emitting diode according to another embodiment of the present disclosure.

FIG. 6 is a schematic cross-sectional view illustrating a light emitting diode 300 according to another embodiment of the present disclosure.

Referring to FIG. 6, the light emitting diode 300 according to this embodiment is substantially similar to the light emitting diode 200 described with reference to FIG. 5, except that an active region 260 includes a plurality of active layers 60g1, 60g2, 60g3, and 60g4 emitting green light and a plurality of active layers 60b1, 60b2, and 60b3 emitting blue light.

In this embodiment, three active layers 60b1, 60b2, and 60b3 emitting blue light, four active layers 60g1, 60g2, 60g3, and 60g4 emitting green light, and one active layer 60r emitting red light may be formed. However, the inventive concepts are not limited thereto, and the number of active layers for each color may be adjusted so as to implement white light without using a phosphor.

The active layers 60b1, 60b2, and 60b3; or 60g1, 60g2, 60g3, and 60g4 emitting light of a same color may emit light having different peak wavelengths, and thus, the light emitting diode 300 may emit four or more colors of polychromatic light. By emitting light having various peak wavelengths, the light emitting diode 300 may implement white light having a higher color rendering index than white light implemented by a combination of a single red light, a single green light, and a single blue light. In addition, since light having various wavelengths can be selected, a color temperature of white light may be freely adjusted while having the high color rendering index.

Figure 7A:
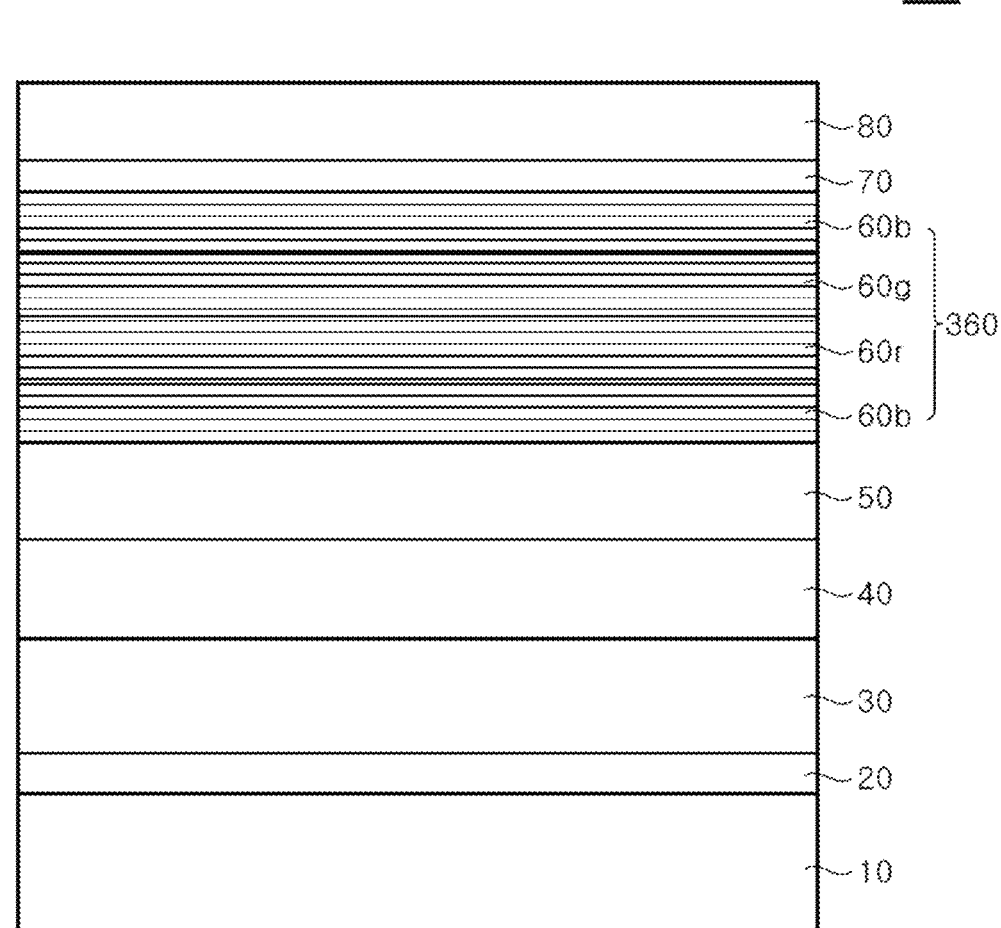
FIG. 7A is a schematic cross-sectional view illustrating a light emitting diode according to another embodiment of the present disclosure.
Figure 7B:
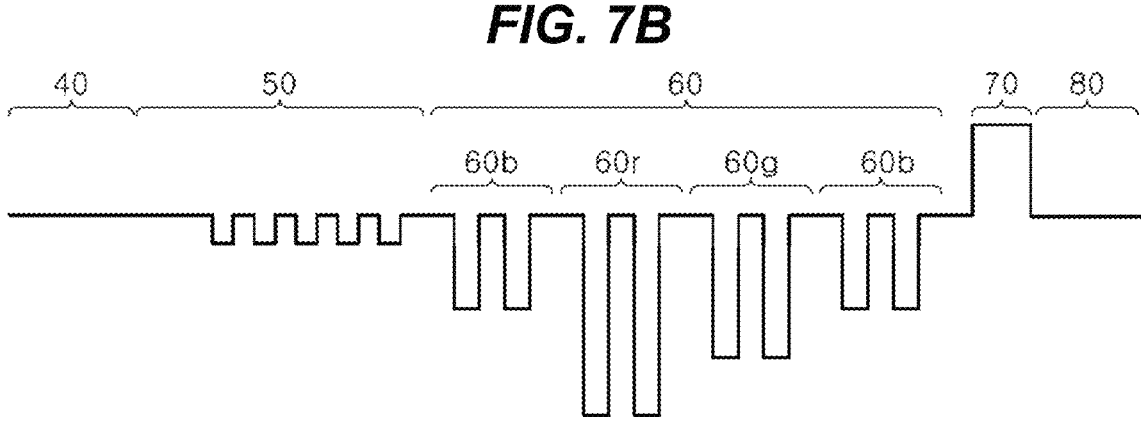
FIG. 7B is a schematic band diagram illustrating the light emitting diode of FIG. 7A.

FIG. 7A is a schematic cross-sectional view illustrating a light emitting diode 400 according to another embodiment of the present disclosure, and FIG. 7B is a schematic band diagram illustrating the light emitting diode 400 of FIG. 7A.

Referring to FIGS. 7A and 7B, the light emitting diode 400 according to this embodiment is substantially similar to the light emitting diode 100 described with reference to FIG. 1, except that an active region 360 includes active layers emitting a plurality of blue light, and an active layer 60g emitting green light and an active layer 60r emitting red light are sandwiched between active layers 60b emitting blue light. In addition, an order of the active layer 60g emitting green light and the active layer 60r emitting red light may be changed.

The active layers 60b emitting blue light may be disposed in an upper portion and a lower portion of the active region 360. The light emitting diode 400 according to this embodiment may emit white light in both directions. That is, the light emitting diode 400 may emit white light not only through a first conductivity type semiconductor layer 40 but also through a second conductivity type semiconductor layer 80.

Figure 8:
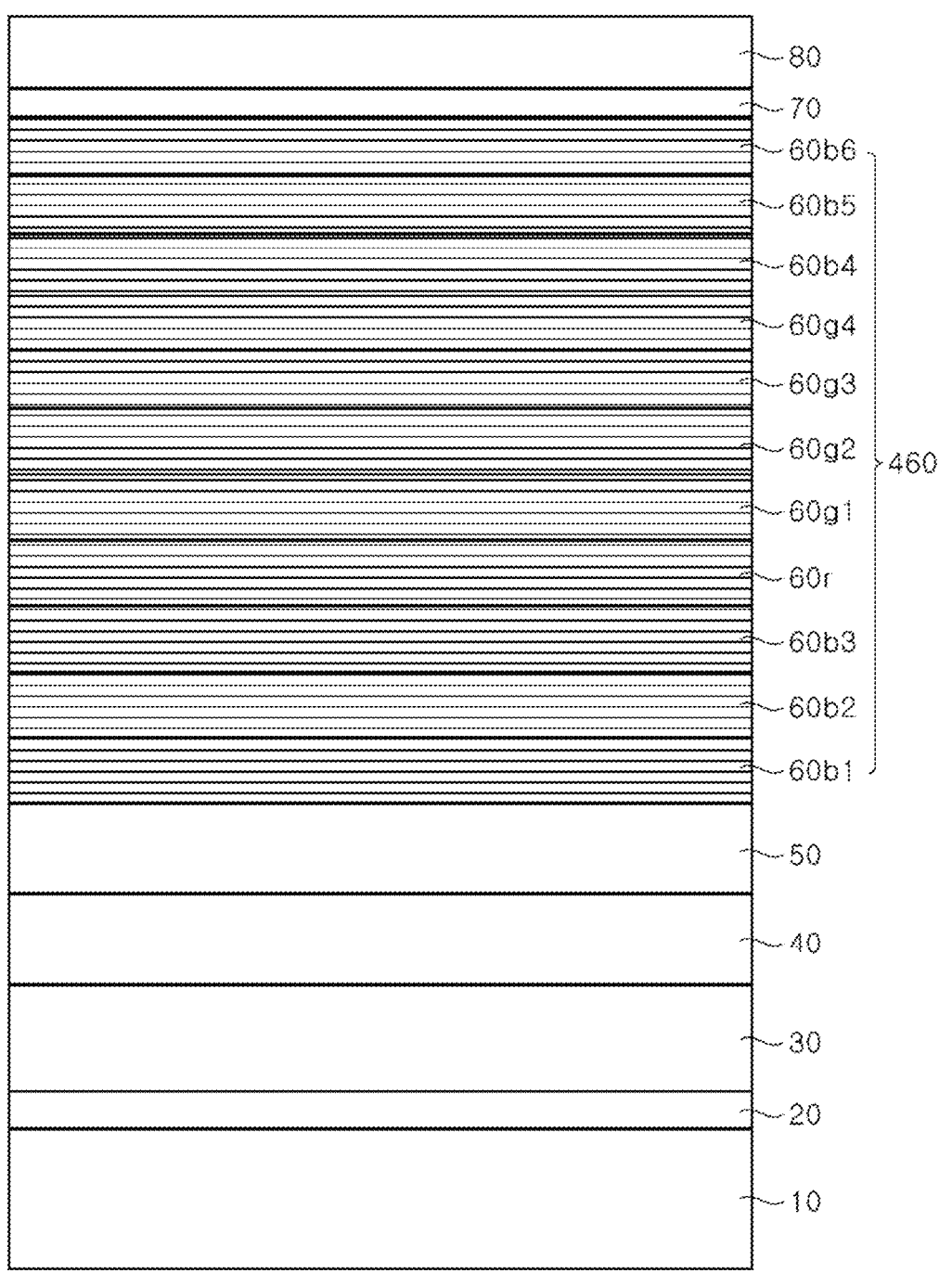
FIG. 8 is a schematic cross-sectional view illustrating a light emitting diode according to another embodiment of the present disclosure.

FIG. 8 is a schematic partial cross-sectional view illustrating a light emitting diode 500 according to another embodiment of the present disclosure.

Referring to FIG. 8, the light emitting diode 500 according to this embodiment is substantially similar to the light emitting diode 400 described with reference to FIG. 7A, except that an active region 460 includes a plurality of active layers 60g1, 60g2, 60g3, and 60g4 emitting green light and a plurality of active layers 60b1, 60b2, 60b3, 60b4, 60b5, and 60b6 emitting blue light. Although one active layer 60r emitting red light is illustrated, a plurality of active layers 60r emitting red light may be disposed. In addition, the plurality of active layers 60b1, 60b2, and 60b3 emitting blue light may be disposed in a lower portion of the active region 460, and the plurality of active layers 60b4, 60b5, and 60b6 emitting blue may be disposed in an upper portion of the active region 460.

Figure 9A:
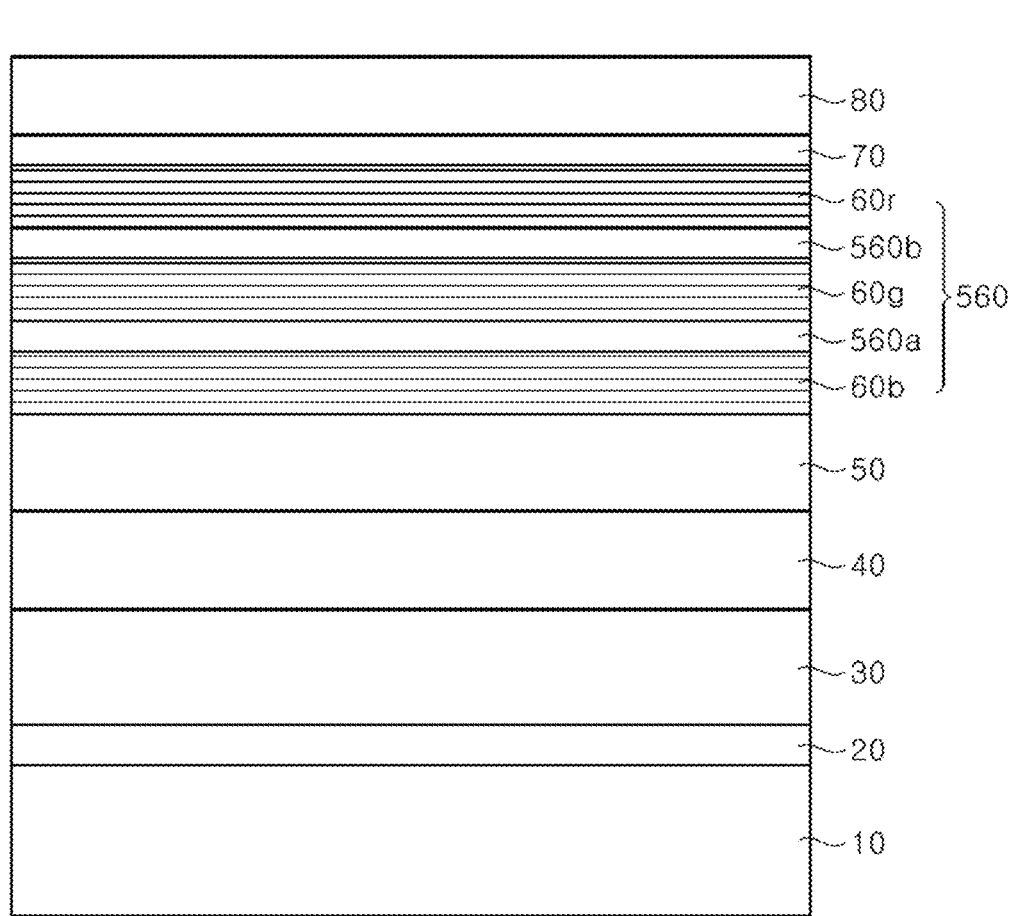
FIG. 9A is a schematic cross-sectional view illustrating a light emitting diode according to another embodiment of the present disclosure.
Figure 9B:
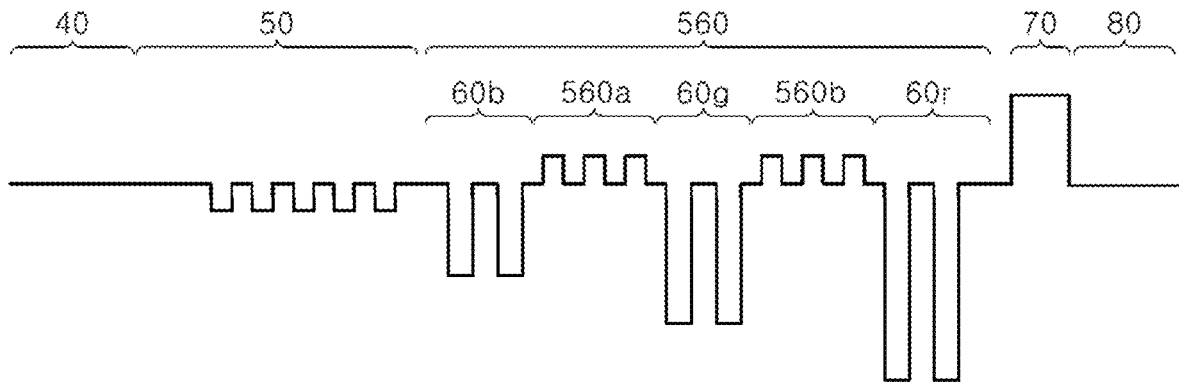
FIG. 9B is a schematic band diagram illustrating the light emitting diode of FIG. 9A.

FIG. 9A is a schematic cross-sectional view illustrating a light emitting diode 600 according to another embodiment of the present disclosure, and FIG. 9B is a schematic band diagram illustrating the light emitting diode 600 of FIG. 9A.

Referring to FIG. 9A and FIG. 9B, the light emitting diode 600 according to this embodiment is substantially similar to the light emitting diode 100 described with reference to FIG. 1, except that an active region 560 further includes intermediate barrier layers 560a and 560b disposed between active layers 60b, 60g, and 60r.

The intermediate barrier layer 560a may be disposed between the active layer 60b emitting blue light and the active layer 60g emitting green light, and the intermediate barrier layer 560b may be disposed between the active layer 60g emitting green light and the active layers 60r emitting red light. In this embodiment, the active region 560 is illustrated and described as including three active layers 60b, 60g, and 60r and two intermediate barrier layers 560a and 560b respectively disposed therebetween, but the inventive concepts are not limited thereto. The active region 560 may include two active layers, and in this case, one intermediate barrier layer may be disposed between the active layers. In addition, although the active region 560 includes three active layers 60b, 60g, and 60r, only one intermediate barrier layer 560a or 560b may be disposed between two active layers 60b and 60g, or 60g and 60r. Furthermore, the active region 560 may include four or more active layers, and in this case, the intermediate barrier layer may be disposed in at least one of regions between the active layers.

The intermediate barrier layers 560a and 560b may include a semiconductor layer having a band gap wider than those of the active layers 60b, 60g, and 60r. For example, the intermediate barrier layers 560a and 560b may include a nitride-based semiconductor layer containing Al, such as an AlGaN layer, and average band gaps of the intermediate barrier layers 560a and 560b may be wider than band gaps of barrier layers in the active layer 60b, 60g, and 60r. The band gaps of the intermediate barrier layers 560a and 560b may be narrower than that of an electron blocking layer 70.

Figures 9C, 10:
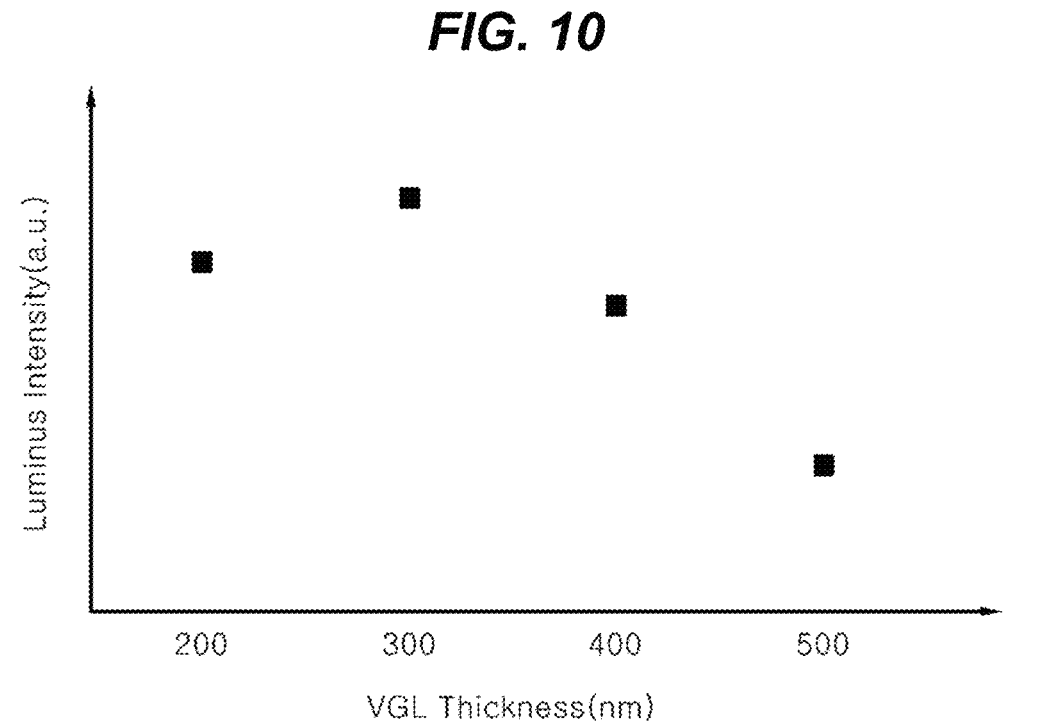
FIG. 9C is a schematic band diagram illustrating the light emitting diode of FIG. 9A.
FIG. 10 is a graph showing luminous intensities depending on thicknesses of VGLs.

The intermediate barrier layers 560a and 560b may be formed of multiple layers, as shown in FIG. 9B, or may be formed of a single layer, as shown in FIG. 9C, and a thickness of each of the intermediate barrier layers 560a and 560b may be greater than thicknesses of the barrier layers in the active layers 60b, 60g, and 60r. Furthermore, the intermediate barrier layers 560a and 560b may be doped with an impurity, such as Si.

The intermediate barrier layers 560a and 560b may control a flow of electrons and holes to increase a luminescent recombination efficiency in the active layers 60b, 60g, and 60r, and may also control an intensity of light emitted from a specific active layer. For example, an injection efficiency of holes may be controlled by adjusting the thicknesses or the band gaps of the intermediate barrier layers 560a and 560b. Accordingly, by adjusting the thicknesses or the band gaps of the intermediate barrier layers 560a and 560b, an intensity ratio of light emitted from the active layers 60b, 60g, and 60r may be adjusted.

FIG. 10 is a graph showing luminous intensities of light emitting diodes depending on thicknesses of VGLs. All other conditions were same, but only thicknesses of the VGLs 51 and 53 were changed to manufacture the light emitting diodes, and luminous intensities of mixed light emitted from the light emitting diodes depending on the thicknesses of the VGLs 51 and 53 were shown in the graph. V-pits increased in size as the thicknesses of the VGLs 51 and 53 increased. The sizes of the V-pits were roughly comparable to an overall thickness of the VGLs. The manufactured light emitting diodes include active layers 60b, 60g, and 60r and intermediate barrier layers 560a and 560b similar to a structure described with reference to FIG. 9A, and also first and second VGLs 51 and 53 were manufactured to have a structure described with reference to FIG. 3A.

In the above case, an Indium concentration of the second VGL 53 was made to include 3~5%. In addition, the thicknesses of the first and second VGLs 51 and 53 were made to have a range of ±20% compared to the size of the V-pit.

Referring to FIG. 10, when the thickness of the VGL was about 300 nm, the light emitting diode exhibited white light and exhibited a highest luminous intensity. A light emitting diode having a VGL thickness of about 200 nm emitted green light instead of white light, and in a case of about 500 nm of the thickness, blue light was emitted. A light emitting diode having a VGL thickness of about 400 nm emitted white light, but had a relatively low luminous intensity.

The thickness of the VGL is proportional to the size of the V-pit. To implement light with the high luminous intensity, it is necessary to adjust the size of the V-pit within a specific range. At least 80% of the V-pits may be formed to have a size within a range of about 250 nm to about 350 nm. Accordingly, it is possible to provide a light emitting diode that emits white light with the high luminous intensity.

Various embodiments have been described above, and the matters described in one embodiment may be applied to other embodiments without departing from the spirit of the present disclosure. For example, the pre-strained layers 50a, 50b, and 50c described with reference to FIGS. 3A through 3C may be applied to the pre-strained layers 50 of FIGS. 5, 6, 7A, 8, and 9A, respectively.

Figure 11:
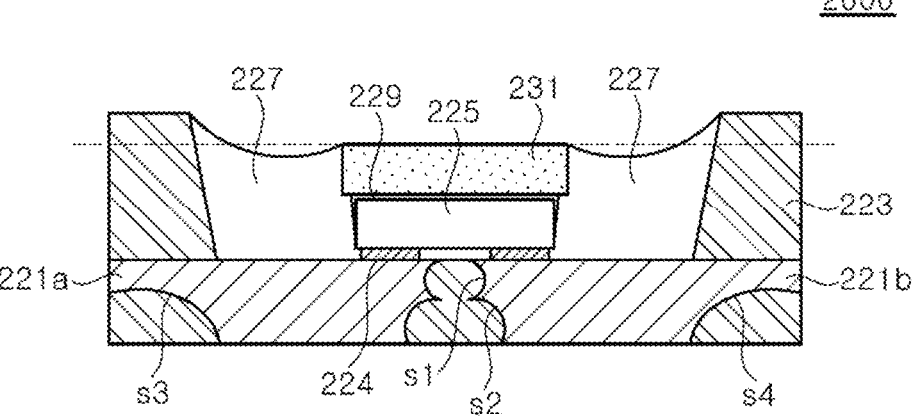
FIG. 11 is a schematic cross-sectional view illustrating a light emitting device according to an embodiment of the present disclosure.

FIG. 11 is a schematic cross-sectional view illustrating a light emitting device 2000 according to an embodiment of the present disclosure.

Referring to FIG. 11, the light emitting device 2000 may include a first lead 221a, a second lead 221b, a housing 223, light emitting diode chips 225, a reflector 227, an adhesive 229, and a wavelength converter 231.

The first lead 221a and the second lead 221b may be formed of a conductive material, for example, a metal. Bottom surfaces of the first lead 221a and the second lead 221b may be partially removed by half-cutting, and thus, may include relatively thin regions. In addition, the first lead 221a and the second lead 221b may be separated from each other by etching. Furthermore, although not shown in the drawing, a through-hole may be formed in each of the first lead 221a and the second lead 221b. The through-hole may be connected to the region in which the bottom surface is partially removed. The through-holes are filled with the housing 223, thereby preventing the leads 221a and 221b from being separated from the housing 223. The through-hole is selectively applicable.

The leads 221a and 221b have surfaces facing each other. The surfaces of the leads 221a and 221b facing each other may be symmetrical. The surface of each of the leads 221a and 221b facing each other may include a first surface s1 and a second surface s2. The first surface s1 may include a region having a first radius of curvature, and the second surface s2 may include a region having a second radius of curvature. The first radius of curvature may have a value different from that of the second radius of curvature. As shown in FIG. 20, the first radius of curvature of the first surface s1 may be smaller than the second radius of curvature of the second surface s2.

Meanwhile, the first and second leads 221a and 221b may include curved surfaces, that is, a third surface s3, and a fourth surface s4, along with vertical surfaces on opposite side surfaces of each other. The opposite side surfaces may be symmetrical, but the inventive concepts are not limited thereto. The third and fourth surfaces s3 and s4 may include a region having different radii of curvature from those of the first and second surfaces s1 and s2. For example, the third surface s3 and the fourth surface s4 may include a region having the radius of curvature greater than those of the first surface s1 and the second surface s2.

Since the side surfaces of the leads 221a and 221b include the regions having different radii of curvature, a coupling force between the leads 221a and 221b and the housing 223 may be enhanced.

The housing 223 covers portions of upper surfaces of the leads 221a and 221b and portions of lower surfaces of the leads 221a and 221b. In particular, the housing 223 may fill the region in which the bottom surface is partially removed by half-cutting, and may fill the through-holes formed in the leads 221a and 221b.

The housing 223 forms a cavity over the leads 221a and 221b. The housing 223 may be formed of, for example, an epoxy molding compound (EMC).

The light emitting diode chip 225 may be electrically connected by flip bonding or wire connection on the first lead 221a and the second lead 221b. The light emitting diode chip 225 may include the light emitting diodes described in the previous embodiments.

A first material layer 231 is disposed over the light emitting diode chip 225. The first material layer 231 may be adhered to the light emitting diode chip 225 through the adhesive 229 or may be disposed as a molding. The adhesive 229 may at least partially cover an upper surface as well as side surfaces of the light emitting diode chip 225. A thickness of the adhesive 229 covering the side surfaces of the light emitting diode chip 225 may be decreased toward a lower surface of the light emitting diode chip 225.

The first material layer 231 may be formed of a light-transmitting material such that light passes as it is without wavelength conversion, or may include a phosphor to convert a wavelength of light so as to implement a desired color coordinate. Since the light emitting diode chip 225 emits mixed-color light, an amount of phosphor used may be relatively less than that of a conventional light emitting device. By using the phosphor together with the light emitting diode chip 225 emitting mixed light, mixed light having a desired color coordinate may be easily implemented.

A second material layer 227 may be formed between an inner wall of the housing 223 and the wavelength converter 231. The second material layer 227 may contact a side surface of the first material layer 231 and may contact the inner wall of the housing 223. The second material layer 227 may also surround the side surfaces of the light emitting diode chip 225. The adhesive 229 may be disposed between the second material layer 227 and the light emitting diode chip 225.

When the second material layer 227 is formed of a reflective material, it may be formed of a material having a higher reflectance than that of the housing 223, and the reflector 227 may include regions having different heights in cross-section view. For example, it may include white silicone. The second material layer 227 may include a concave upper surface. A lowest height of a concave portion may be disposed lower than an upper surface (indicated by a dotted line) of the first material layer 231, and an uppermost end of the second material layer 227 may be disposed higher than the upper surface of the first material layer 231. Accordingly, light emitted in a lateral direction from the first material layer 231 may be reflected from the concave upper surface of the second material layer 227, and thus, light may be collected in an upper direction of the light emitting diode chip 225.

However, the inventive concepts are not necessarily limited thereto, and the first material layer 231 and the second material layer 227 may be formed of a same material and formed in one shape. In other words, one material layer may cover the side surfaces and the upper surface of the light emitting diode chip 225 and may fill an interior of a cavity of the housing 223.

The light emitting device 2000 according to the illustrated embodiment may easily implement mixed color light having a desired color coordinate by using the phosphor together with the light emitting diode chip 225 emitting mixed color light.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

What is claimed is:

1. A light emitting diode, comprising:
a first conductivity type semiconductor layer;
an active region including a plurality of active layers;
a pre-strained layer disposed between the first conductivity type semiconductor layer and the active region, and including a V-pit generation layer (VGL); and
a second conductivity type semiconductor layer disposed on the active region,
wherein the VGL has a thickness within a range of 250 nm to 350 nm, wherein the active region emits white light including a plurality of peak wavelengths.

2. The light emitting diode of claim 1, wherein the VGL includes a first VGL and a second VGL.

3. The light emitting diode of claim 2, wherein the first VGL is a single layer, and the second VGL is a superlattice layer.

4. The light emitting diode of claim 3, wherein the superlattice layer includes an InGaN layer, and a band gap energy of the InGaN layer is equal to or greater than an energy of light of 405 nm.

5. The light emitting diode of claim 2, wherein the first VGL is a layer formed using TMGa as a Ga source, and the second VGL is formed using TEGa as the Ga source.

6. The light emitting diode of claim 2, wherein the pre-strained layer further includes a first intermediate layer and a second intermediate layer, and the first and second intermediate layers are nitride-based semiconductor layers having a lattice constant smaller than that of the active region.

7. The light emitting diode of claim 6, wherein one of the first and second intermediate layers is an AlN layer, and the other is an AlGaN layer.

8. The light emitting diode of claim 6, wherein the first intermediate layer and the second intermediate layer are disposed between the first VGL and the second VGL.

9. The light emitting diode of claim 6, wherein the first and second VGLs have a thickness within a range of 1000 Å to 2500 Å, respectively, and the first and second intermediate layers have a thickness within a range of 10 Å to 150 Å, respectively.

10. The light emitting diode of claim 1, wherein the active region includes at least one active layer emitting blue light, at least one active layer emitting green light, and at least one active layer emitting red light, the blue light has a peak wavelength within a range of 410 nm to 495 nm, the green light has a peak wavelength within a range of 520 nm to 605 nm, and the red light has a peak wavelength within a range of 606 nm to 720 nm.

11. The light emitting diode of claim 10, wherein the active layers emitting green light and red light are disposed between a plurality of active layers emitting blue light.

12. The light emitting diode of claim 1, wherein the active region further includes an intermediate barrier layer disposed between the active layers, and the intermediate barrier layer has a wider energy band gap than those of barrier layers in the active layers.

13. The light emitting diode of claim 12, wherein the intermediate barrier layer is formed of a single layer or multiple layers.

14. The light emitting diode of claim 12, further comprising an electron blocking layer, wherein the intermediate barrier layer has a narrower energy band gap than that of the electron blocking layer.

15. The light emitting diode of claim 12, wherein the active region includes at least three active layers, and the intermediate barrier layer is disposed in at least one of regions between the active layers.

16. A light emitting diode, comprising:
a first conductivity type semiconductor layer;
an active region including a plurality of active layers;
a pre-strained layer disposed between the first conductivity type semiconductor layer and the active region, and including V-pit generation layers (VGLs); and
a second conductivity type semiconductor layer disposed on the active region, wherein:
the pre-strained layer includes a first VGL, a second VGL, a first intermediate layer, and a second intermediate layer, and
the first intermediate layer and the second intermediate layer have a lattice constant greater than that of the active region.

17. The light emitting diode of claim 16, wherein the active region emits white light having a plurality of peak wavelengths.

18. The light emitting diode of claim 16, wherein the first VGL is a GaN layer, the second VGL is a GaN/InGaN superlattice layer, one of the first and second intermediate layers is an AlN layer, and the other is an AlGaN layer.

19. The light emitting diode of claim 16, wherein the first intermediate layer and the second intermediate layer are disposed between the first VGL and the second VGL.

20. A light emitting diode, comprising:
a first conductivity type semiconductor layer;
an active region including a plurality of active layers;
a pre-strained layer disposed between the first conductivity type semiconductor layer and the active region, and including a V-pit generation layer (VGL) including a first VGL and a second VGL; and
a second conductivity type semiconductor layer disposed on the active region,
wherein the VGL has a thickness within a range of 250 nm to 350 nm, and wherein the pre-strained layer further includes a first intermediate layer and a second intermediate layer, and the first and second intermediate layers are nitride-based semiconductor layers having a lattice constant smaller than that of the active region.

\* \* \* \* \*